(12) United States Patent
Nishi

(10) Patent No.: US 7,585,779 B2
(45) Date of Patent: Sep. 8, 2009

(54) FABRICATION METHOD OF SEMICONDUCTOR DEVICE

(75) Inventor: Masahiro Nishi, Nakakoma-gun (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/390,105

(22) Filed: Mar. 28, 2006

(65) Prior Publication Data
US 2006/0223326 A1  Oct. 5, 2006

(30) Foreign Application Priority Data
Mar. 31, 2005 (JP) ............................. 2005-105160

(51) Int. Cl.
*H01L 21/302* (2006.01)
(52) U.S. Cl. ................. 438/724; 438/706; 438/720; 438/745
(58) Field of Classification Search ................. 438/706, 438/710, 714, 712, 720, 603, 606, 724; 216/59, 216/67, 58
See application file for complete search history.

(56) References Cited

U.S. PATENT DOCUMENTS

| | | | |
|---|---|---|---|
| 5,789,265 A * | 8/1998 | Nitta et al. | |
| 6,239,490 B1 * | 5/2001 | Yamada et al. | 257/745 |
| 6,499,767 B1 * | 12/2002 | Takemura | 281/33 |
| 7,070,702 B1 * | 7/2006 | Eason et al. | 216/87 |
| 7,132,699 B2 * | 11/2006 | Kimura et al. | 257/192 |
| 2002/0142563 A1 * | 10/2002 | Sakai et al. | 438/410 |
| 2003/0053505 A1 | 3/2003 | Bour et al. | |
| 2003/0082893 A1 * | 5/2003 | Matsumoto et al. | 438/522 |
| 2004/0029330 A1 * | 2/2004 | Hussain et al. | 438/172 |
| 2004/0119082 A1 * | 6/2004 | Sugawara | 257/94 |
| 2004/0233950 A1 * | 11/2004 | Furukawa et al. | 372/43 |
| 2005/0048747 A1 * | 3/2005 | Hussain et al. | 438/572 |
| 2005/0139825 A1 * | 6/2005 | Song et al. | 257/44 |
| 2005/0161696 A1 * | 7/2005 | Yuri | 257/103 |

FOREIGN PATENT DOCUMENTS

| | | |
|---|---|---|
| JP | 2001-111172 A | 4/2001 |
| JP | 2002-232006 A | 8/2002 |
| JP | 2003-101068 A | 4/2003 |
| JP | 2004-006934 A | 1/2004 |
| JP | 2004-273501 A | 9/2004 |

OTHER PUBLICATIONS

Japanese Office Action, Japanese Patent Application No. 2005-105160 dated Oct. 14, 2008.
Japanese Office Action mailed Apr. 7, 2009, issued in corresponding Japanese Application No. 2005- 105160.

* cited by examiner

*Primary Examiner*—Lan Vinh
(74) *Attorney, Agent, or Firm*—Westerman, Hattori, Daniels & Adrian, LLP.

(57) ABSTRACT

A fabrication method of a semiconductor device includes steps of performing any one of $O_2$ ashing, organic processing, and dry etching on a surface of a GaN-based semiconductor layer, etching the surface of the GaN-based semiconductor layer in a mixed solution of acid and an oxidizing agent, and forming an electrode on the surface of the GaN-based semiconductor layer.

7 Claims, 4 Drawing Sheets

FABRICATION METHOD OF SEMICONDUCTOR DEVICE

BACKGROUND OF THE INVENTION

1. Field of the Invention

This invention generally relates to a fabrication method of a semiconductor device, and more particularly, to a method of fabricating a GaN-based semiconductor device.

2. Description of the Related Art

Semiconductor devices that employ a nitride-based compound semiconductor, in particular, the semiconductor devices that employ gallium nitride (GaN) (hereinafter, referred to as GaN-based semiconductor devices) are used as power devices that operate at high frequencies and high power. Field effect transistors are especially known as semiconductor devices that are suitable for amplification in high-frequency bands such as microwave, millimeter wave, and sub-millimeter wave. In a field effect transistor, a source electrode, drain electrode, and gate electrode are formed on a GaN semiconductor substrate on which layers such as an AlGaN supply layer, GaN cap layer, and the like are deposited.

The field effect transistor having the aforementioned structure can be fabricated in a production process such as organic processing, oxygen ashing, dry etching, and the like. The organic processing denotes a process that uses a developer for forming the pattern. The oxygen ashing denotes a process that removes the organic remainder after the pattern is formed.

In the process such as organic processing, oxygen ashing, dry etching, and the like, an affected layer is generated on a surface of the GaN cap layer. As an analysis result of the affected layer generated on the surface of the GaN cap layer by use of EDX, it has been confirmed that the affected layer includes GaO. A path of leakage current that flows between the gate and drain, which is thought to be caused by the affected layer, lowers the breakdown voltage.

SUMMARY OF THE INVENTION

The present invention has been made in view of the above circumstances and it is an object of the present invention is to provide a semiconductor device in which the generation of a current leakage path can be prevented in order to maintain the high breakdown voltage for high-power operation.

According to an aspect of the present invention, preferably, there is provided a fabrication method of a semiconductor device including: performing any one of $O_2$ ashing, organic processing, and dry etching on a surface of a GaN-based semiconductor layer; etching the surface of the GaN-based semiconductor layer in a mixed solution of acid and an oxidizing agent; and forming an electrode on the surface of the GaN-based semiconductor layer. Accordingly, affected layers can be removed efficiently by use of a mixed solution of acid and the oxidizing agent. This prevents the current leak path from generating and a stable ohmic contact is obtainable, making it possible to prevent the breakdown voltage from being lowered in the semiconductor device fabricated in accordance with the present invention.

According to another aspect of the present invention, preferably, there is provided a fabrication method of a semiconductor device including: performing any one of $O_2$ ashing, organic processing, and dry etching on a surface of a GaN-based semiconductor layer; dry etching the surface of the GaN-based semiconductor layer by a gas that includes Cl; and forming an electrode on the surface of the GaN-based semiconductor layer. The affected layers can be removed efficiently with the use of the gas that includes Cl.

According to yet another aspect of the present invention, preferably, there is provided a fabrication method of a semiconductor device including: forming an insulation film on a surface of a GaN-based semiconductor layer; providing a mask having an opening on the insulation film; removing the insulation film through the mask to expose the GaN-based semiconductor layer; etching an exposed portion of the GaN-based semiconductor layer in a mixed solution of acid and an oxidizing agent; and forming an electrode on the exposed portion of the GaN-based semiconductor layer.

According to still another aspect of the present invention, preferably, there is provided a fabrication method of a semiconductor device including: forming an insulation film on a surface of a GaN-based semiconductor layer; providing a mask having an opening on the insulation film; removing the insulation film through the mask to expose the GaN-based semiconductor layer; dry etching the GaN-based semiconductor layer by a gas that includes Cl; and forming an electrode on the exposed portion of the GaN-based semiconductor layer.

According to still another aspect of the present invention, preferably, there is provided a fabrication method of a semiconductor device comprising: etching a surface of a GaN-based semiconductor layer in a mixed solution of acid and an oxidizing agent; and providing an insulation film on the surface of the GaN-based semiconductor layer.

According to still another aspect of the present invention, preferably, there is provided a fabrication method of a semiconductor device including: dry etching a surface of a GaN-based semiconductor layer by a gas that includes Cl; and providing an insulation film on the surface of the GaN-based semiconductor layer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
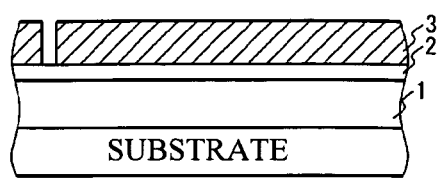
FIG. 1A through FIG. 1K are views showing a fabrication flow that explains a fabrication method of a semiconductor device in accordance with a first embodiment of the present invention.

FIG. 1A through FIG. 1K are views showing a fabrication flow that explains a fabrication method of a semiconductor device in accordance with a first embodiment of the present invention. The fabrication method shown in FIG. 1A through FIG. 1K is capable of suppressing the generation of the affected layer on the GaN-based semiconductor layer, by covering the surface of the GaN-based semiconductor layer with a SiN film. Referring to FIG. 1A, a SiN protection layer 2 having a film thickness of approximately 100 nm and a resist pattern 3 having an opening are successively deposited on a GaN-based semiconductor layer 1 by plasma CVD or the like. The GaN-based semiconductor layer 1 is composed of a semiconductor such as GaN, AlGaN, or the like. The resist pattern 3 can be formed by applying resist on the SiN protection layer 2 and implementing a patterning process on the applied resist to remove a marker forming portion of the resist.

Figure 1B:
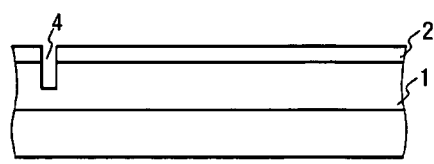

Subsequently, referring to FIG. 1B, the marker forming portion of the SiN protection layer 2 and GaN-based semiconductor layer 1 are dry etched. This provides a marker 4 in the GaN-based semiconductor layer 1. Then, the resist pattern 3 is removed by ashing or the like.

Figure 1C:
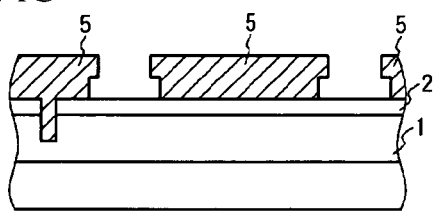

Next, referring to FIG. 1C, a resist pattern 5 is provided on the SiN protection layer 2. The resist pattern 5 can be formed by implementing a patterning process on the resist pattern 3 to remove a drain electrode forming portion and a source electrode forming portion. Here, the resist pattern 5 has an overhang shape, which is suitable for liftoff.

Figure 1D:
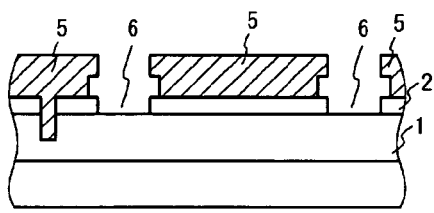

Then, referring to FIG. 1D, the SiN protection layer 2 in the drain electrode forming portion and in the source electrode forming portion is dry etched with the use of $SF_6$ gas. This exposes the GaN-based semiconductor layer 1 in the drain electrode forming portion and in the source electrode forming portion, and a contact hole 6 is provided. In this case, nitrogen is released from the GaN-based semiconductor layer 1, while etching is being performed with the use of $SF_6$ gas. Accordingly, gallium and oxygen bond, resulting in the generation of the affected layer.

Next, the exposed portion in the GaN-based semiconductor layer 1 is dry etched with the use of a gas that includes Cl. In dry etching, for example, any one of RIE, ICP, and ECR may be employed. $SiCl_4$ gas, $BCl_3$ gas, or the like may be employed for the gas that includes Cl. In this manner, the affected layer generated in the exposed portion is removed.

Figure 1E:
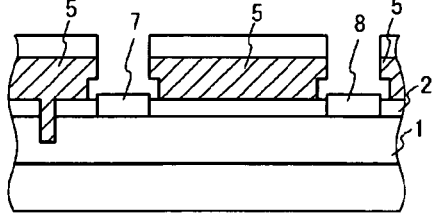

Now, referring to FIG. 1E, a source electrode 7 is deposited in the contact hole 6 in the source electrode forming portion, and a drain electrode 8 is deposited in the contact hole 6 in the drain electrode forming portion by the vacuum deposition method. The source electrode 7 and the drain electrode 8 are made of Al/Pd/Ti-based metal, Al/Ta-based metal, or the like, for example, and establish an ohmic contact with the GaN-based semiconductor layer 1.

Figure 1F:
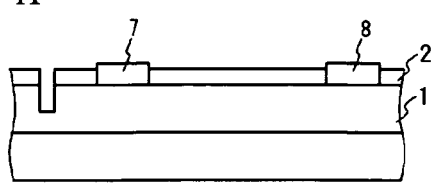
Figure 1G:
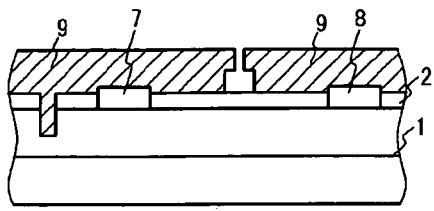

Then, referring to FIG. 1F, the resist pattern 5 is lifted off and removed. Referring now to FIG. 1G, a resist pattern 9 having an overhang shape with an opening is provided on the source electrode 7, the drain electrode 8, and the SiN protection layer 2. The resist pattern 9 can be formed by applying resist on the source electrode 7, the drain electrode 8, and the SiN protection layer 2 and implementing a patterning process to remove the resist applied on the gate electrode forming portion between the source electrode 7 and the drain electrode 8.

Figure 1H:
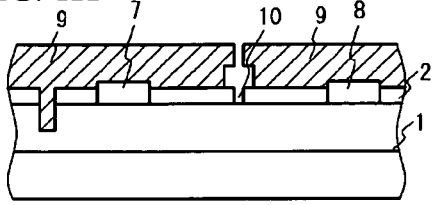

Next, referring to FIG. 1H, the SiN protection layer 2 in the gate electrode forming portion is dry etched with the use of $SF_6$ gas. This exposes the GaN-based semiconductor layer 1 in the gate electrode forming portion, resulting in the formation of a contact hole 10. In this case, the affected layer is also generated by the afore-mentioned etch process as seen in FIG. 1D, as will be described later. Subsequently, the exposed portion in the GaN-based semiconductor layer 1 is dry etched with the use of the gas that includes Cl. $SiCl_4$ gas, $BCl_3$ gas, or the like may be employed for the gas that includes Cl. In this manner, the affected layer generated in the exposed portion in the GaN-based semiconductor layer 1 is removed by the etch processing.

Figure 1I:
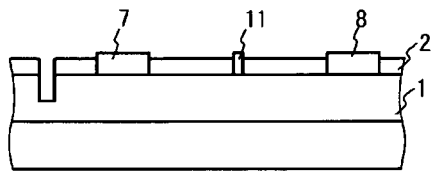

Referring now to FIG. 1I, a gate electrode 11 is deposited in the contact hole 10 provided on the GaN-based semiconductor layer 1 by vacuum deposition method. The gate electrode 11 is made of Ni/Au-based metal, TiWN-based metal, or the like, for example, and the resist pattern 9 is lifted off and removed.

Figure 1J:
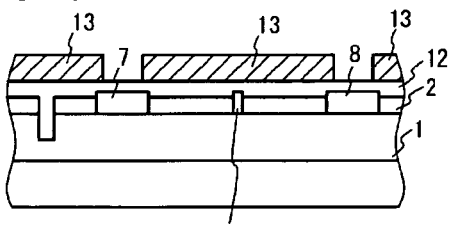
Figure 1K:
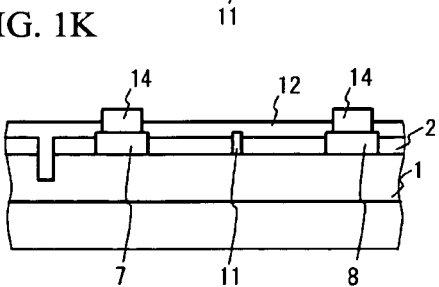

Subsequently, referring to FIG. 1J, an interlayer film 12 and a resist pattern 13 having an opening are successively formed on the SiN protection layer 2, the source electrode 7, the drain electrode 8, and the gate electrode 11. The resist pattern 13 can be formed by applying resist above the interlayer film 12 and implementing a patterning process. Then, the interlayer film 12 provided on the source electrode 7 and the drain electrode 8 is dry etched with the use of $SF_6$ gas or the like. Subsequently, referring to FIG. 1K, an Au wiring 14 is provided on the source electrode 7 and the drain electrode 8 by the vacuum deposition method. The resist pattern 13 is lifted off and removed. In the process described heretofore, a semiconductor device 100 is completed.

As described above, the affected layer that is formed in the exposed portion in the GaN-based semiconductor layer 1 is removed, and then the source electrode 7, the drain electrode 8, and the gate electrode 11 are formed. Accordingly, this can prevent the path for the leakage current from generating between the gate and drain. It is thus possible to prevent the breakdown voltage from being lowered in the semiconductor device 100.

Second Embodiment

FIG. 2A through FIG. 2I are views showing a fabrication flow that explains a fabrication method of a semiconductor device in accordance with a second embodiment of the present invention. First, referring to FIG. 2A, a resist pattern 22 is provided on a cap layer 21c. A semiconductor layer 21 has a laminated structure in which a supply layer 21b made of AlGaN and the cap layer 21c made of n-type GaN are successively laminated on a GaN layer 21a. The cap layer 21c serves as a surface protection layer of the semiconductor layer below the cap layer 21c. The resist pattern 22 can be formed by applying resist on the cap layer 21c and implementing a patterning process to remove a marker forming portion.

Figure 2A:
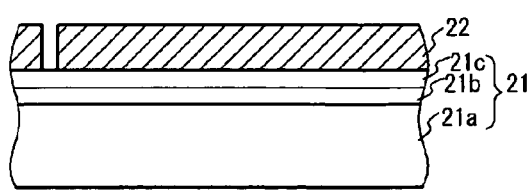
FIG. 2A through FIG. 2I are views showing a fabrication flow that explains the fabrication method of the semiconductor device in accordance with a second embodiment of the present invention.
Figure 2F:
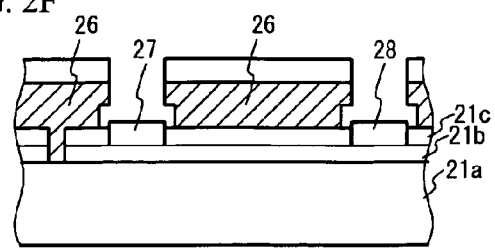
Figure 2B:
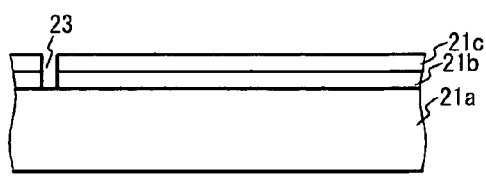

Next, referring to FIG. 2B, the resist pattern is provided on the cap layer 21c, and Ar is injected. Then, the resist pattern is removed. Subsequently, referring to FIG. 2C, a resist pattern 24 having an opening is formed on the cap layer 21c. The resist pattern 24 can be formed by applying resist on the cap layer 21c and removing the resist applied on a drain electrode forming portion and on source electrode forming portion.

Figure 2G:
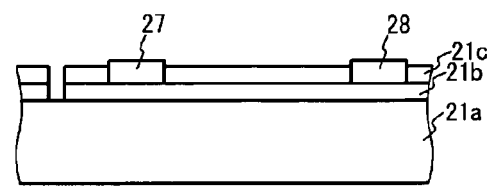
Figure 2C:
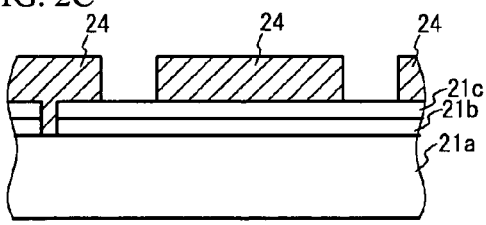
Figure 2H:
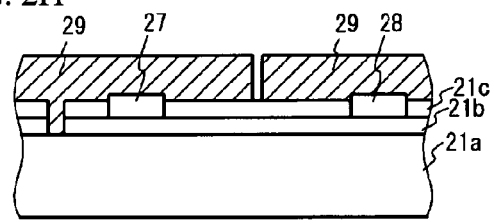
Figure 2D:
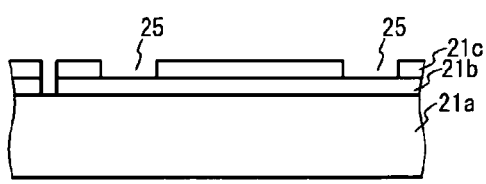

Then, referring to FIG. 2D, the cap layer 21c in the drain electrode forming portion and in the source electrode forming portion is dry etched. In this manner, contact holes 25 are formed in the cap layer 21c, and the supply layer 21b in the drain electrode forming portion and in the source electrode forming portion is exposed. Subsequently, the resist pattern 24 is removed by ashing or the like. Then, the supply layer 21b and the cap layer 21c are etched.

In this case, wet etching process can be performed by use of a mixed aqueous solution of acid and oxidizing agent. For instance, etching is carried out for approximately 10 minutes in a mixed aqueous solution of $H_2SO_4:H_2O_2=3:1$. This wet etch process by use of the mixed aqueous solution removes the affected layers, which have been generated on the supply layer 21b and the cap layer 21c during the ashing process. As the mixed aqueous solution of acid and oxidizing agent, $HF+HNO_3$, $H_3PO_4+H_2O_2$, $HF+H_2O$, and the like may be applicable. In addition, an aqueous solution of $NH_4OH+H_2O_2$ may be used, instead of the mixed aqueous solution of acid and oxidizing agent. Furthermore, a dry etching may be carried out by use of a $SiCl_4$ gas, $BCl_3$ gas, or the like, instead of the wet etching. Preferably, after the wet etch process is performed by use of a mixed aqueous solution, another wet etch process in HF is performed. In this case, the affected layers generated on the supply layer 21b and on the cap layer 21c are removed for certainty.

Figure 2I:
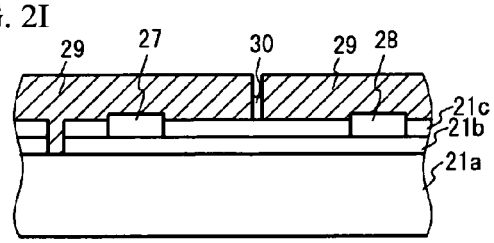
Figure 2E:
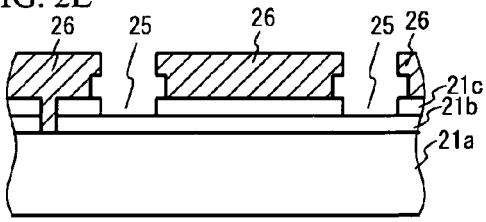

Referring now to FIG. 2E, a resist pattern 26 having an opening is provided on the supply layer 21b and the cap layer 21c. The resist pattern 26 can be formed by applying resist on the supply layer 21b and the cap layer 21c and implementing the patterning to remove the resist in the contact holes 25. Here, the resist pattern 26 has an overhang shape. Also in this case, there is the possibility that the affected layer is generated on the supply layer 21b in an organic processing. Therefore, the etch process is carried out so that the affected layers are removed in a mixed aqueous solution of $HCL:H_2O_2=1:10$, for example.

Next, referring to FIG. 2F, a source electrode 27 and a drain electrode 28 are deposited in the contact holes 25 by the vacuum deposition method. The source electrode 27 and the drain electrode 28 are made of, for example, Al/Pd/Ti-based metal, Al/Ta-based metal, or the like, and establish an ohmic contact with the supply layer 21b.

Then, referring to FIG. 2G, the resist pattern 26 is lifted off and removed. Referring to FIG. 2H, a resist pattern 29 is provided on the source electrode 27, the drain electrode 28, and the cap layer 21c. The resist pattern 29 can be formed by applying resist on the source electrode 27, the drain electrode 28, and the cap layer 21c and implementing the patterning process to remove the gate electrode forming portion arranged between the source electrode 27 and the drain electrode 28. Also in this case, the gate electrode forming portion is etched in a mixed aqueous solution of $HCl:H_2O_2=1:10$, prior to the vacuum deposition.

Next, referring to FIG. 2I, a gate electrode 30 is formed on the cap layer 21c in the gate electrode forming portion by the vacuum deposition method. The gate electrode 30 is made of, for example, Ni/Au-based metal, TiWN-based metal, or the like.

Third Embodiment

A description will now be given of a third embodiment of the present invention. In accordance with the third embodiment of the present invention, the affected layer is removed after an ohmic electrode and the gate electrode are formed. Oxide sometimes remains on the surface of the GaN-based semiconductor layer after the epitaxial growth. The oxide remaining below an insulation film causes a formation of leakage path. Therefore, the oxide formed below the insulation film can be removed by implementing the etch process in accordance with the present invention on the insulation film. Hereinafter, a description will be given in detail.

Figure 3A:
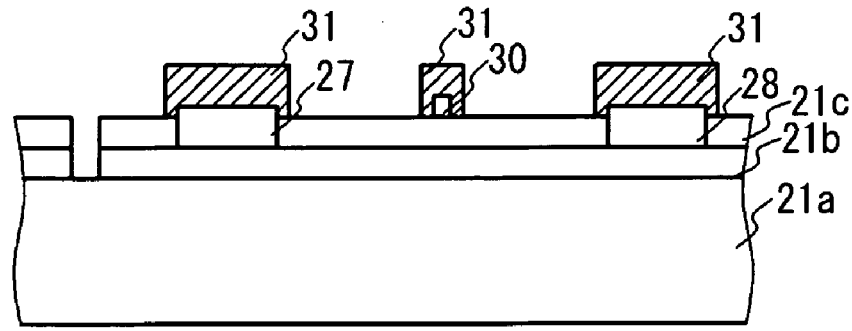
FIG. 3A through FIG. 3C are views showing a fabrication flow that explains the fabrication method of the semiconductor device in accordance with a third embodiment of the present invention.

First, the semiconductor substrate as shown in FIG. 2I is prepared. Then, referring to FIG. 3A, the resist pattern 31 having an opening is provided on the source electrode 27, the drain electrode 28, and the gate electrode 30. The resist pattern 31 can be formed by applying resist on the cap layer 21c, the source electrode 27, the drain electrode 28, and the gate electrode 30 and then removing the resist so as to leave the resist applied on the source electrode 27, the drain electrode 28, and the gate electrode 30.

Subsequently, the dry etch process is performed on the cap layer 21c (with the use of $SiCl_4$ gas, $BCl_3$ gas, or the like). This enables to remove the affected layer generated on the cap layer 21c. Then, the resist pattern 31 is removed. In this case, wet etching may be applicable, yet an etchant has to be diluted, because the resist pattern is used as a mask.

Figure 3B:
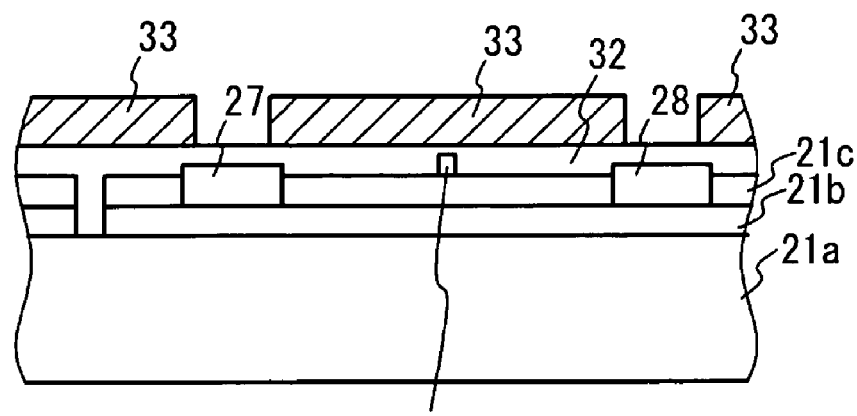

Then, referring to FIG. 3B, an interlayer film 32 and a resist pattern 33 having an opening are successively formed on the cap layer 21c, the source electrode 27, the drain electrode 28, and the gate electrode 30. The interlayer film 32 is fabricated of an insulator such as SiN or the like, and can be formed by sputtering. The resist pattern 33 can be formed by applying resist on the interlayer film 32 and implementing the patterning process to remove the resist applied above the source electrode 27 and the drain electrode 28.

Figure 3C:
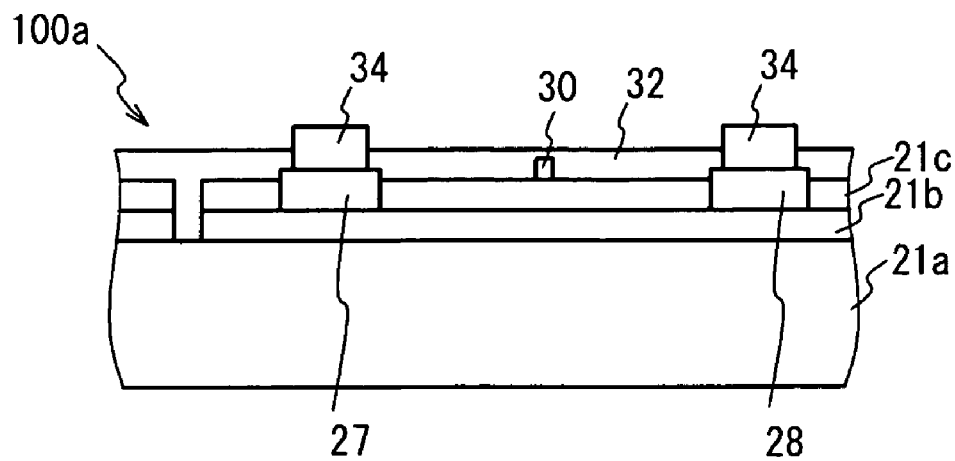

Next, referring to FIG. 3C, the interlayer film 32 provided on the source electrode 27 and the drain electrode 28 is dry etched by the $SF_6$ gas. This exposes the source electrode 27 and the drain electrode 28. Subsequently, an Au wiring is deposited on the source electrode 27 and the drain electrode 28 by the vacuum deposition method. Then, the resist pattern is lifted off and removed. In the processes described heretofore, a semiconductor device 100a is completed.

As described heretofore, the source electrode 27, the drain electrode 28, and the gate electrode 30 are formed, after the affected layers generated on the exposed portions on the supply layer 21b and the cap layer 21c are removed, enabling to prevent the formation of the leakage path of the leakage current between the gate and drain. This makes it possible to prevent the breakdown voltage from being lowered in the semiconductor device 100a.

Figure 4A:
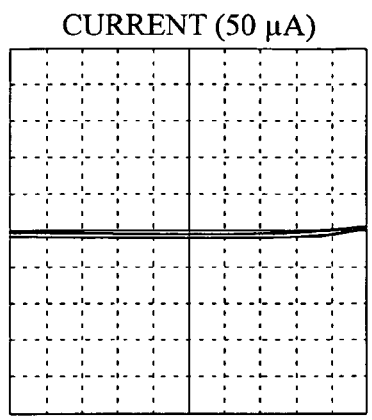
FIG. 4A through FIG. 4D are views showing breakdown characteristics of the semiconductor device.
Figure 4B:
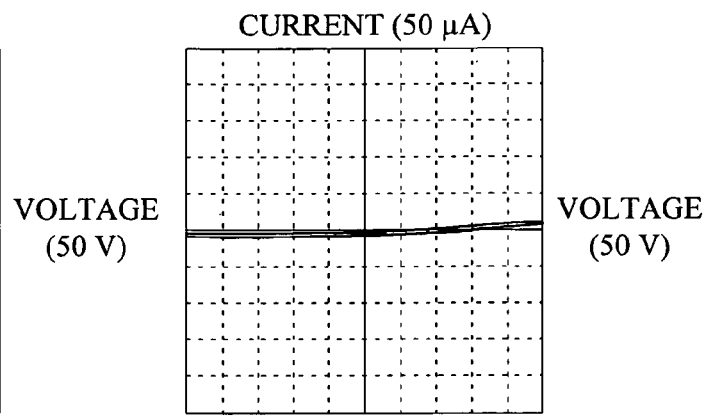
Figure 4C:
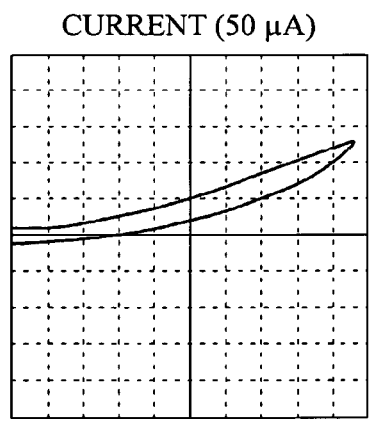
Figure 4D:
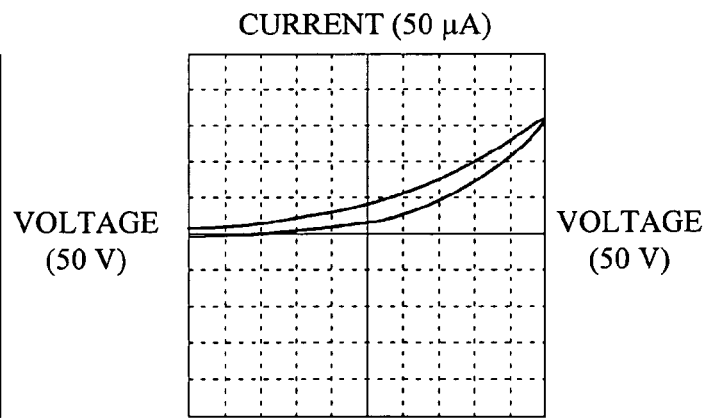

FIG. 4A through FIG. 4D are graphs explaining breakdown characteristic of the semiconductor device 100. FIG. 4A shows the breakdown characteristic of the semiconductor device shown in FIG. 1I. FIG. 4B shows the breakdown characteristic of the semiconductor device shown in FIG. 1K. FIG. 4C shows the breakdown characteristic of the semiconductor device shown in FIG. 1I, when the dry etch process with the gas that includes Cl is not performed in FIG. 1D and FIG. 1H. FIG. 4D shows the breakdown characteristic of the semiconductor device shown in FIG. 1K, when the dry etch process with the gas that includes Cl is not performed in FIG. 1D and FIG. 1H. Horizontal axis shown in FIG. 4A through FIG. 4D denotes a gate leakage current. Vertical axis shown in FIG. 4A through FIG. 4D denotes a gate-drain voltage.

As shown in FIG. 4A and FIG. 4B, even if the gate-drain voltage is increased, the gate leakage current is hardly generated. In contrast, as shown in FIG. 4C and FIG. 4D, the gate leakage current is increased as the gate-drain voltage is increased. For instance, in FIG. 4C, approximately 50 µA of the gate leakage current is generated in 100 V of the gate-drain voltage.

As described heretofore, it is possible to prevent the current leakage path from generating between the gate and the drain, by performing the dry etch process with the gas that includes Cl in FIG. 1D and FIG. 1H. This enables to prevent the breakdown voltage from being lowered in the semiconductor device 100. In addition, the same effect is obtainable in the semiconductor device 100a.

Furthermore, the present invention is applicable not only to the semiconductor device such as HEMT, MESFET, or the like but also to the GaN-based semiconductor.

In the above-described fabrication method, a surface may be treated in hydrofluoric acid after the etching process is performed in the mixed aqueous solution of acid and the oxidizing agent. The affected layers on the GaN-based semiconductor layer can be removed with certainty.

In the above-described fabrication method, the mixed aqueous solution of acid and the oxidizing agent may be a mixture of any one of $HF+HNO_3$, $H_2SO_4+H_2O_2+H_2O$, $H_3PO_4+H_2O_2+H_2O$, $H_3PO_4+H_2O_2$, and $HF+H_2O+H_2O_2$.

The present invention is not limited to the above-mentioned embodiments, and other embodiments, variations and modifications may be made without departing from the scope of the present invention.

The present invention is based on Japanese Patent Application No. 2005-105160 filed on Mar. 31, 2005, the entire disclosure of which is hereby incorporated by reference.

What is claimed is:

1. A fabrication method of a semiconductor device comprising:
   a first step of performing dry etching a SiN protection film, on a surface of a GaN-based semiconductor layer wherein said surface is in part directly covered by the SiN protection film; and wherein said first step is free of Cl;
   directly after said first step performing a second step of dry etching an affected layer of Ga and O formed on the GaN-based semiconductor layer during the first step by a gas that includes Cl; and
   forming an electrode on the surface of the GaN-based semiconductor layer.

2. A fabrication method of a semiconductor device comprising:
   a first step of forming an electrode on a surface of a GaN-based semiconductor layer;
   after the first step performing a second step of performing organic processing on an exposed surface of the GaN-based semiconductor layer;
   after the second step performing a third step of etching the exposed surface of the GaN-based semiconductor layer in a mixed solution of acid and $H_2O_2$; and
   after the third step performing a fourth step of providing an insulation film on the surface of the electrode and the GaN-based semiconductor layer.

3. A fabrication method of a semiconductor device composed of a first GaN-based semiconductor layer and a second GaN-based semiconductor layer grown directly thereon, comprising:
   a first step of forming a hole in the second GaN-based semiconductor layer through which a surface of the first a GaN-based semiconductor layer is exposed;
   after the first step performing a second step of performing any one of $O_2$ ashing, organic processing, and dry etching on the exposed surface of the first GaN-based semiconductor layer in the hole and the surface of the second GaN-based semiconductor layer;
   after the second step performing a third step of etching the exposed surface of the first GaN-based semiconductor layer in the hole and the surface of the second GaN-based semiconductor layer in a mixed solution of acid and $H_2O_2$; and
   after the third step performing a fourth step of forming an electrode on the exposed surface of the first GaN-based semiconductor layer in the hole.

4. The fabrication method as claimed in claim 3, wherein the mixed solution of acid and $H_2O_2$ is a mixture of any one of $H_2SO_4+H_2O_2+H_2O$, $H_3PO_4+H_2O_2+H_2O$, $H_3PO_4+H_2O_2$, and $HF+H_2O+H_2O_2$.

5. The fabrication method as claimed in claim 3, wherein the step of dry etching by the gas that includes Cl is carried out by any one of RIE, ICP, and ECR.

6. The fabrication method as claimed in claim 3, wherein the GaN-based semiconductor layer is either GaN or AlGaN.

7. A fabrication method of a semiconductor device comprising:
   a first step of forming an electrode on a surface of a GaN-based semiconductor layer;
   after the first step performing a second step of performing organic processing on an exposed surface of the GaN-based semiconductor layer;
   after the second step performing a third step of dry etching the exposed surface of the GaN-based semiconductor layer by a gas including Cl; and
   after the third step performing a fourth step of providing an insulation film on the surface of the electrode and the GaN-based semiconductor layer.

\* \* \* \* \*